(12) United States Patent
Mizuochi et al.

(10) Patent No.: US 10,865,262 B2
(45) Date of Patent: Dec. 15, 2020

(54) UPPER-LAYER FILM FORMING COMPOSITION AND METHOD FOR PRODUCING A PHASE-SEPARATED PATTERN

(71) Applicant: NISSAN CHEMICAL CORPORATION, Tokyo (JP)

(72) Inventors: Ryuta Mizuochi, Toyama (JP); Yasunobu Someya, Toyama (JP); Hiroyuki Wakayama, Toyama (JP); Rikimaru Sakamoto, Toyama (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 0 days.

(21) Appl. No.: 16/332,330

(22) PCT Filed: Sep. 8, 2017

(86) PCT No.: PCT/JP2017/032434
§ 371 (c)(1),
(2) Date: Mar. 11, 2019

(87) PCT Pub. No.: WO2018/051907
PCT Pub. Date: Mar. 22, 2018

(65) Prior Publication Data
US 2019/0233559 A1 Aug. 1, 2019

(30) Foreign Application Priority Data

Sep. 13, 2016 (JP) .................... 2016-178280

(51) Int. Cl.
| | | |
|---|---|---|
| *C08F 212/08* | (2006.01) |
| *B05D 1/38* | (2006.01) |
| *C08L 53/00* | (2006.01) |
| *H01L 21/3065* | (2006.01) |
| *B05D 7/00* | (2006.01) |
| *C09D 179/08* | (2006.01) |
| *C09D 125/04* | (2006.01) |
| *C09D 153/00* | (2006.01) |
| *C08L 35/06* | (2006.01) |
| *H01L 21/312* | (2006.01) |
| *B32B 27/30* | (2006.01) |
| *C08K 5/06* | (2006.01) |
| *B05D 7/24* | (2006.01) |
| *C08F 220/30* | (2006.01) |
| *H01L 21/027* | (2006.01) |
| *B05D 3/04* | (2006.01) |

(Continued)

(52) U.S. Cl.
CPC .............. *C08F 212/08* (2013.01); *B05D 1/38* (2013.01); *B05D 3/0453* (2013.01); *B05D 7/24* (2013.01); *B05D 7/50* (2013.01); *B05D 7/54* (2013.01); *B32B 27/281* (2013.01); *B32B 27/30* (2013.01); *B32B 27/302* (2013.01); *B32B 27/308* (2013.01); *C08F 220/06* (2013.01); *C08F 220/18* (2013.01); *C08F 220/30* (2013.01); *C08F 222/40* (2013.01); *C08F 299/024* (2013.01); *C08K 5/06* (2013.01); *C08L 35/06* (2013.01); *C08L 53/00* (2013.01); *C09D 125/04* (2013.01); *C09D 153/00* (2013.01); *C09D 179/08* (2013.01); *H01L 21/027* (2013.01); *H01L 21/3065* (2013.01); *H01L 21/312* (2013.01); *B05D 1/005* (2013.01); *B05D 3/0254* (2013.01); *B05D 3/105* (2013.01); *B05D 2202/00* (2013.01); *B05D 2401/31* (2013.01); *B05D 2502/005* (2013.01); *C08F 220/1806* (2020.02); *C08F 220/24* (2013.01); *C08F 220/301* (2020.02); *C08F 220/302* (2020.02)

(58) Field of Classification Search
CPC ........ C08F 8/30; C08F 212/08; C08F 222/40; H01L 21/0337
See application file for complete search history.

(56) References Cited

U.S. PATENT DOCUMENTS

| | | | |
|---|---|---|---|
| 2006/0134556 A1* | 6/2006 | Nealey ................ | B81C 1/00031 430/311 |
| 2009/0178832 A1 | 7/2009 | Amou et al. | |

(Continued)

FOREIGN PATENT DOCUMENTS

| | | |
|---|---|---|
| JP | 2004-224894 A | 8/2004 |
| JP | 2009-167268 A | 7/2009 |

(Continued)

OTHER PUBLICATIONS

Yang et al Efficient Synthesis of Poly(methacrylic acid)-block-Poly(styrene-altN phenylmaleimide) Diblock Copolymer Lamellae Using RAFT Dispersion Polymerization, Macromolecules 2013, 46, 8545-8556, published on Oct. 18, 2013.*

(Continued)

*Primary Examiner* — Gregory Listvoyb
(74) *Attorney, Agent, or Firm* — Oliff PLC

(57) ABSTRACT

An overlay film-forming composition used to cause phase separation to a block copolymer-containing layer formed on a substrate, the composition including: (A) a copolymer that includes (a) a unit structure derived from maleimide structure and a unit structure derived from styrene structure; and (B) an ether compound having 8-16 carbon atoms as a solvent. The overlay film-forming composition exhibits good solubility with respect to a hydrophobic solvent, and is able to induce vertical alignment of a block copolymer without causing dissolution, swelling, and the like of the block copolymer-containing layer formed on the substrate.

14 Claims, 1 Drawing Sheet

(51) Int. Cl.
   *B32B 27/28*    (2006.01)
   *C08F 220/06*   (2006.01)
   *C08F 220/18*   (2006.01)
   *C08F 222/40*   (2006.01)
   *C08F 299/02*   (2006.01)
   *B05D 3/10*     (2006.01)
   *B05D 1/00*     (2006.01)
   *B05D 3/02*     (2006.01)
   *C08F 220/24*   (2006.01)

(56) References Cited

U.S. PATENT DOCUMENTS

| | | | |
|---|---|---|---|
| 2009/0182093 A1* | 7/2009 | Cheng | C09D 125/14 525/88 |
| 2011/0111170 A1* | 5/2011 | Yamauchi | C08J 5/18 428/131 |
| 2011/0262859 A1 | 10/2011 | Kusabiraki et al. | |
| 2013/0245152 A1 | 9/2013 | Soda et al. | |
| 2013/0344242 A1 | 12/2013 | Willson et al. | |
| 2014/0335324 A1* | 11/2014 | Kim | B44C 1/227 428/195.1 |
| 2015/0315402 A1* | 11/2015 | Someya | C09D 125/08 428/195.1 |

FOREIGN PATENT DOCUMENTS

| | | |
|---|---|---|
| JP | 2011-122081 A | 6/2011 |
| JP | 2015-005750 A | 1/2015 |
| WO | 2011/118644 A1 | 9/2011 |
| WO | 2012/073742 A1 | 6/2012 |
| WO | 2013/146715 A1 | 10/2013 |

OTHER PUBLICATIONS

Nov. 21, 2017 International Search Report issued in International Patent Application No. PCT/JP2017/032434.

* cited by examiner

UPPER-LAYER FILM FORMING COMPOSITION AND METHOD FOR PRODUCING A PHASE-SEPARATED PATTERN

TECHNICAL FIELD

The present invention relates to an upper-layer film forming composition and a method for producing a phase-separated pattern.

BACKGROUND ART

In the technique in which a block copolymer layer formed on a substrate, such as a semiconductor substrate, is allowed to take place phase separation, part of the block copolymer is removed, and thereafter the substrate is subjected to etching, there has been well known a method comprising forming an upper-layer film on the block copolymer layer and subjecting it to, for example, heat annealing so that the film is controlled to have a desired lithography pattern. A conventional upper-layer film is quickly dissolved in a hydrophilic solvent, such as water, methanol, or isopropanol; however, the film does not exhibit high solubility in a hydrophobic solvent, representatively in diisoamyl ether.

CITATION LIST

Patent Literature

Patent Literature 1: JP 2015-5750 A

SUMMARY OF INVENTION

Technical Problem

Therefore, there has been awaited the development of an upper-layer film forming composition for providing an upper-layer film, which has a good solubility in a hydrophobic solvent and a capability of inducing vertical orientation of a block copolymer without dissolving or swelling a layer comprising the block copolymer formed on a substrate.

Solution to Problem

The present invention embraces the followings.

[1] An upper-layer film forming composition for use in causing phase-separation in a layer comprising a block copolymer formed on a substrate, comprising:

(A) a copolymer comprising (a) a unit structure derived from maleimide structure and a unit structure derived from styrene structure; and (B) an ether compound having 8 to 16 carbon atoms as a solvent.

[2] The composition according to item [1] above, wherein the unit structure derived from maleimide structure is represented by the following formula (1):

[Formula 1]

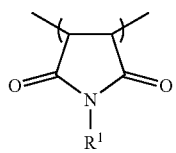

Formula (1)

wherein $R^1$ represents a hydrogen atom, a linear, branched, or cyclic alkyl group having 1 to 10 carbon atoms, or an aryl group having 6 to 10 carbon atoms and being optionally substituted with a halogen atom.

[3] The composition according to item [1] or [2] above, wherein the unit structure derived from styrene structure is represented by the following formula (2):

[Formula 2]

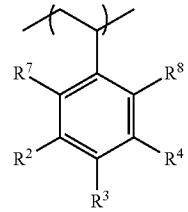

Formula (2)

wherein each of $R^2$ to $R^4$, $R^7$, and $R^8$ independently represents a hydrogen atom, an alkoxy group having 1 to 5 carbon atoms, or a linear, branched, or cyclic alkyl group having 1 to 10 carbon atoms and being optionally substituted with a halogen atom.

[4] The composition according to any one of items [1] to [3] above, wherein copolymer (A) further comprises (b) a unit structure derived from (meth)acryl group.

[5] The composition according to item [4] above, wherein the unit structure derived from (meth)acryl group is represented by the following formula (3):

[Formula 3]

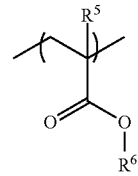

Formula (3)

wherein each of $R^5$ and $R^6$ independently represents a hydrogen atom, an alkoxy group having 1 to 5 carbon atoms, or a linear, branched, or cyclic alkyl group having 1 to 10 carbon atoms and being optionally substituted with a halogen atom.

[6] The composition according to any one of items [1] to [5] above, comprising copolymer (A) from copolymerization of a monomer mixture comprising:

a compound represented by the following formula (4):

[Formula 4]

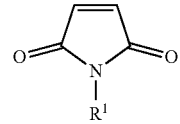

Formula (4)

wherein $R^1$ represents a hydrogen atom, a linear, branched, or cyclic alkyl group having 1 to 10 carbon atoms, or an aryl group having 6 to 10 carbon atoms and being optionally substituted with a halogen atom, and a compound represented by the following formula (5):

[Formula 5]

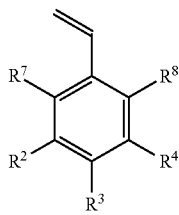

Formula (5)

wherein each of $R^2$ to $R^4$, $R^7$, and $R^8$ independently represents a hydrogen atom, an alkoxy group having 1 to 5 carbon atoms, or a linear, branched, or cyclic alkyl group having 1 to 10 carbon atoms and being optionally substituted with a halogen atom.

[7] A method for forming a block copolymer phase-separated pattern, comprising the steps of:
 (1) forming a block copolymer layer on a substrate;
 (2) forming an upper-layer film on the block copolymer layer with the composition according to any one of claims 1 to 6; and
 (3) causing phase separation in the block copolymer layer formed on the substrate.

[8] A method for producing a pattern, comprising the steps of:
 (1) forming a block copolymer layer on a substrate;
 (2) forming an upper-layer film on the block copolymer layer with the composition according to any one of claims 1 to 6;
 (3) causing phase separation in the block copolymer layer formed on the substrate; and
 (4) subjecting the phase-separated block copolymer layer to etching.

[9] A method for producing a semiconductor device, comprising the steps of:
 (1) forming a block copolymer layer on a substrate;
 (2) forming an upper-layer film on the block copolymer layer with the composition according to any one of claims 1 to 6;
 (3) causing phase separation in the block copolymer layer formed on the substrate;
 (4) subjecting the phase-separated block copolymer layer to etching; and
 (5) subjecting the substrate to etching.

[10] An upper-layer film for use in causing phase separation in a layer comprising a block copolymer formed on a substrate, comprising:
 (A) a copolymer comprising (a) a unit structure derived from maleimide structure and a unit structure derived from styrene structure.

[11] A laminate comprising:
 a layer comprising a block copolymer formed on a substrate; and
 an upper-layer film layer, formed on the layer, comprising (A) a copolymer comprising (a) a unit structure derived from maleimide structure and a unit structure derived from styrene structure.

Advantageous Effects of Invention

An upper-layer film produced using the upper-layer film forming composition of the present invention exhibits a good solubility in a hydrophobic solvent to which the block copolymer is insoluble, and can induce vertical orientation of the block copolymer.

DESCRIPTION OF EMBODIMENTS

[1. Upper-Layer Film Forming Composition]

Figure 1:
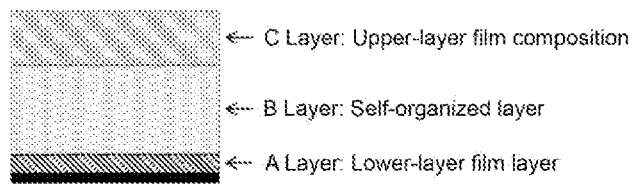
FIG. 1 A view showing the arrangement of a substrate, a lower-layer film (A layer), a self-organized film (B layer), and an upper-layer film composition (C layer).

The upper-layer film forming composition of the present invention is an upper-layer film forming composition for use in causing phase-separation in a layer comprising a block copolymer formed on a substrate, comprising:
 (A) a copolymer comprising (a) a unit structure derived from maleimide structure and a unit structure derived from styrene structure; and
 (B) an ether compound having 8 to 16 carbon atoms as a solvent.

The composition of the present invention can be used as an upper-layer film forming composition in a manner that includes application of the composition onto a block copolymer thin film to form a film, heating of the resultant upper-layer film and the block copolymer to control the orientation of the block copolymer, and removal of the upper-layer film thereafter. Use of the upper-layer film formed from the composition of the present invention permits orientation of a block copolymer layer that could not be oriented merely by heating.

[(a) Copolymer]
[Copolymer Comprising (a) a Unit Structure Derived from Maleimide Structure and a Unit Structure Derived from Styrene Structure]

In the present specification, the terms "maleimide structure" and "styrene structure" are referred to chemical structures having maleimide and styrene, respectively, as a scaffold. The wording "unit structure derived from" maleimide structure or styrene structure is referred to a repeating unit which is derived from a compound having the above-mentioned maleimide structure or styrene structure while maintaining the scaffold of the compound, and which constitutes the backbone of the copolymer.

The unit structure derived from maleimide structure is preferably represented by the following formula (1):

[Formula 6]

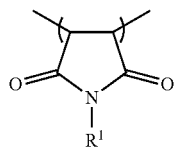

Formula (1)

wherein $R^1$ represents a hydrogen atom, a linear, branched, or cyclic alkyl group having 1 to 10 carbon atoms, or an aryl group having 6 to 10 carbon atoms and being optionally substituted with a halogen atom.

The unit structure derived from styrene structure is preferably represented by the following formula (2):

[Formula 7]

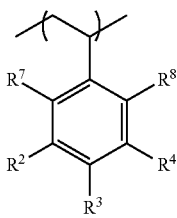

Formula (2)

wherein each of $R^2$ to $R^4$, $R^7$, and $R^8$ independently represents a hydrogen atom, an alkoxy group having 1 to 5 carbon atoms, or a linear, branched, or cyclic alkyl group having 1 to 10 carbon atoms and being optionally substituted with a halogen atom.

$R^7$ and $R^8$ are preferably a hydrogen atom.

The molar ratios of the unit structures represented by any of formula (1) and formula (2) relative to the total of copolymer (A) are desirably as follows:
the structural unit of formula (1): 30 to 70 mol %, and
the structural unit of formula (2): 20 to 50 mol %,
based on the total mole of copolymer (A).

[(b) Unit Structure Derived from (Meth)Acryl Group]

Copolymer (A) may further comprise (b) a unit structure derived from (meth)acryl group, in addition to formula (1) and formula (2).

In the present invention, the "(meth)acryl group" means both an acryl group and a methacryl group. The "(meth) acrylate compound" means both an acrylate compound and a methacrylate compound. For example, (meth)acrylic acid means acrylic acid and methacrylic acid.

The unit structure derived from (meth)acryl group is preferably represented by the following formula (3):

[Formula 8]

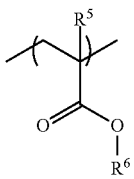

Formula (3)

wherein each of $R^5$ and $R^6$ independently represents a hydrogen atom, an alkoxy group having 1 to 5 carbon atoms, or a linear, branched, or cyclic alkyl group having 1 to 10 carbon atoms and being optionally substituted with a halogen atom.

The molar ratio of the unit structure of formula (3) to the total of copolymer (A) ranges from 0.1 to 50 mol %, more preferably from 0.1 to 30 mol %, further preferably from 0.1 to 20 mol %, most preferably from 0.1 to 10 mol %, based on the total mole of copolymer (A).

In formulae (1), (2), and (3) above, examples of linear, branched, or cyclic alkyl groups having 1 to 10 carbon atoms include a methyl group, an ethyl group, a n-propyl group, an i-propyl group, a cyclopropyl group, a n-butyl group, an i-butyl group, a s-butyl group, a t-butyl group, a cyclobutyl group, a 1-methyl-cyclopropyl group, a 2-methyl-cyclopropyl group, a n-pentyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a 1,1-diethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, a n-hexyl group, a 1-methyl-n-hexyl group, a 1-methyl-n-pentyl group, a 2-methyl-n-pentyl group, a 3-methyl-n-pentyl group, 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-1-methyl-cyclopropyl group, a 2-ethyl-2-methyl-cyclopropyl group, a 2-ethyl-3-methyl-cyclopropyl group, a n-heptyl group, a 1-methyl-n-heptyl group, a n-octyl group, a 1-methyl-n-octyl group, a n-nonyl group, a 1-methyl-n-nonyl group, and a n-decanyl group.

In formulae (1), (2), and (3) above, examples of aryl groups having 6 to 10 carbon atoms include a phenyl group, a benzyl group, and a naphthyl group.

In formulae (1), (2), and (3) above, examples of alkoxy groups having 1 to 5 carbon atoms include a methoxy group, an ethoxy group, a n-propoxy group, an i-propoxy group, a cyclopropoxy group, a n-butoxy group, an i-butoxy group, a s-butoxy group, a t-butoxy group, a cyclobutoxy group, a 1-methyl-cyclopropoxy group, a 2-methyl-cyclopropoxy group, a n-pentoxy group, a 1-methyl-n-butoxy group, a 2-methyl-n-butoxy group, a 3-methyl-n-butoxy group, a 1,1-dimethyl-n-propoxy group, a 1,2-dimethyl-n-propoxy group, a 2,2-dimethyl-n-propoxy group, a 1-ethyl-n-propoxy group, a 1,1-diethyl-n-propoxy group, a cyclopentoxy group, a 1-methyl-cyclobutoxy group, a 2-methyl-cyclobutoxy group, a 3-methyl-cyclobutoxy group, a 1,2-dimethyl-cyclopropoxy group, a 2,3-dimethyl-cyclopropoxy group, a 1-ethyl-cyclopropoxy group, and a 2-ethyl-cyclopropoxy group.

Examples of halogen atoms include F, Cl, Br, and I.

With respect to the distribution of the unit structures represented by formulae (1), (2), and (3) in copolymer (A), there is no particular limitation. Specifically, in copolymer (A), the unit structures represented by formulae (1) and (2) may be alternating-copolymerized or random-copolymerized. When the unit structure represented by formula (3) coexists, the unit structures represented by formulae (1), (2), and (3) in copolymer (A) may constitute their respective blocks, or may be randomly bonded to each other.

The repeating number of the unit structures represented by formulae (1), (2), and (3) in copolymer (A) may be appropriately selected so that the mol % ratio of the unit structures is in the above-mentioned range and the weight average molecular weight Mw of copolymer (A) is in the range of from 5,000 to 500,000, preferably 10,000 to 100,000.

[Method for Producing Copolymer (A)]

A method for producing copolymer (A) used in the present invention comprises the step of carrying out copolymerization of a monomer mixture comprising: a compound represented by the following formula (4):

[Formula 9]

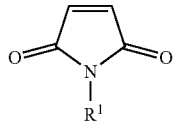

Formula (4)

wherein $R^1$ represents a hydrogen atom, a linear, branched, or cyclic alkyl group having 1 to 10 carbon atoms, or an aryl group having 6 to 10 carbon atoms and being optionally substituted with a halogen atom, and
a compound represented by the following formula (5):

[Formula 10]

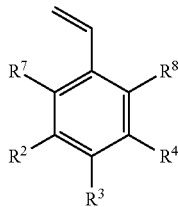

Formula (5)

wherein each of $R^2$ to $R^4$, $R^7$, and $R^8$ independently represents a hydrogen atom, an alkoxy group having 1 to 5 carbon atoms, or a linear, branched, or cyclic alkyl group having 1 to 10 carbon atoms and being optionally substituted with a halogen atom.

$R^7$ and $R^8$ are preferably a hydrogen atom.

Optionally, into the monomer mixture may further been incorporated a compound represented by the following formula (6):

[Formula 11]

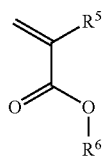

Formula (6)

wherein each of $R^5$ and $R^6$ independently represents a hydrogen atom, an alkoxy group having 1 to 5 carbon atoms, or a linear, branched, or cyclic alkyl group having 1 to 10 carbon atoms and being optionally substituted with a halogen atom.

The "linear, branched, or cyclic alkyl group having 1 to 10 carbon atoms", "aryl group having 6 to 10 carbon atoms", "alkoxy group having 1 to 5 carbon atoms", and "halogen atom" are as described above.

The monomer mixture preferably contains the compounds represented by formula (4) and formula (5) in the following proportion:
the compound represented by formula (4): 30 to 70 mol %, and
the compound represented by formula (5): 20 to 50 mol %, based on the total mole of copolymer (A).

When the monomer mixture contains the compound represented by formula (6), it preferably contains the compounds in the following proportion:
the compound represented by formula (4): 30 to 70 mol %,
the compound represented by formula (5): 20 to 50 mol %, and
the compound represented by formula (6): 0.1 to 40 mol %, based on the total mole of copolymer (A).

As specific examples of compounds represented by formula (4), there can be mentioned the followings.

[Formula 12]

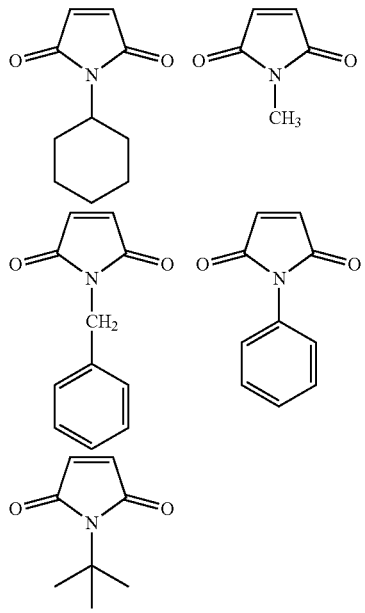

Specific examples of compounds represented by formula (5) include the followings.

[Formula 13]

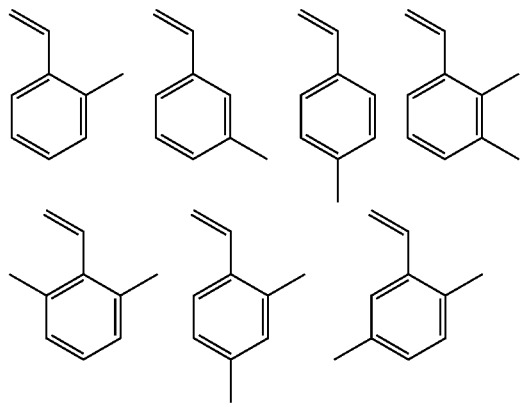

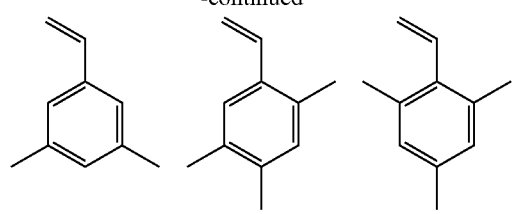
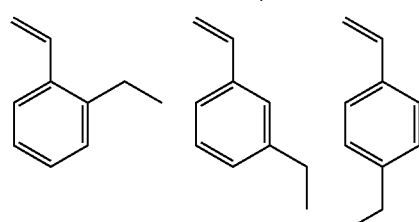
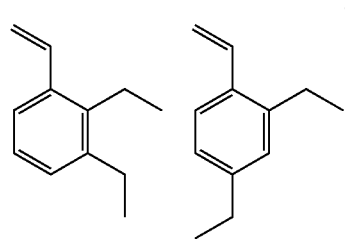
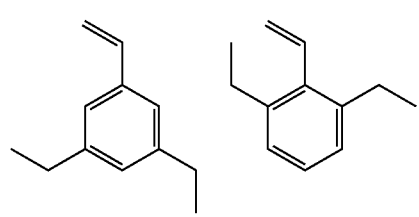
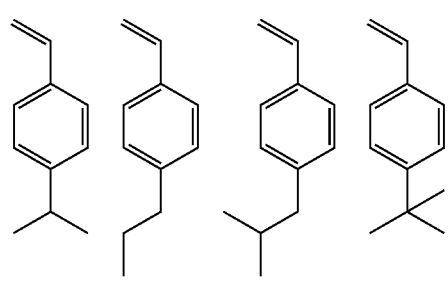
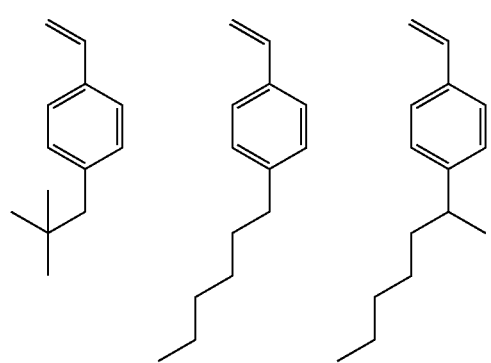
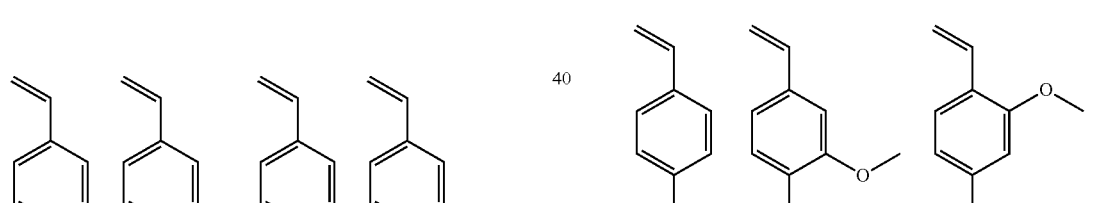
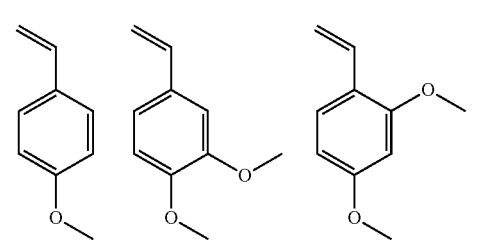
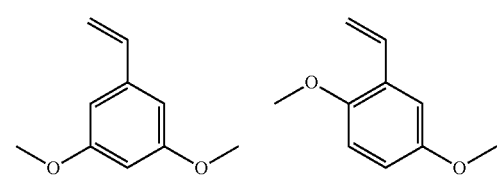
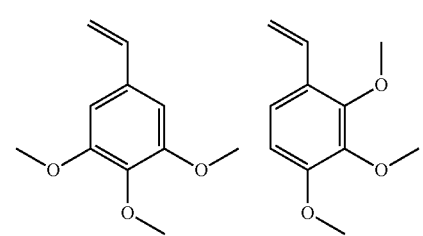

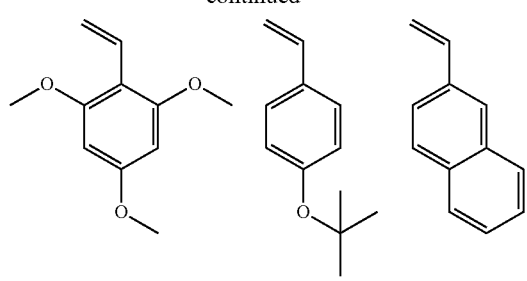

Specific examples of compounds represented by formula (6) include the followings.

[Formula 14]

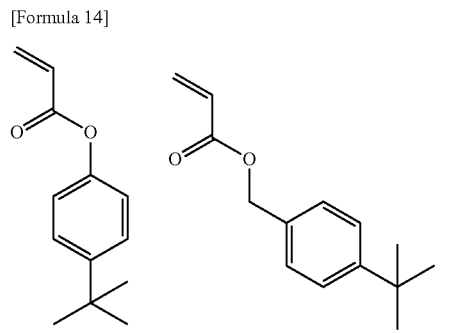

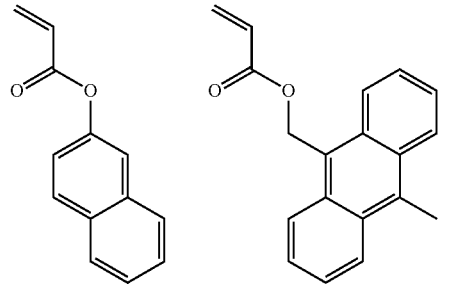

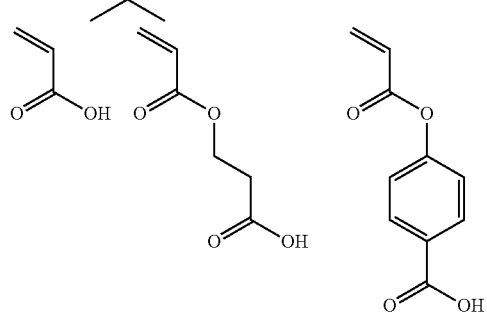

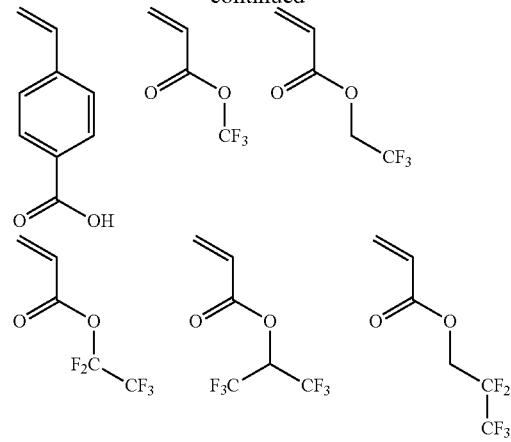

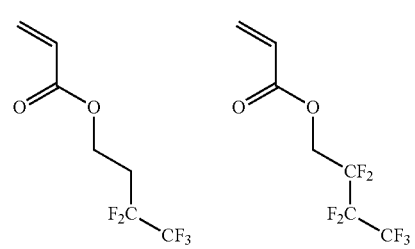

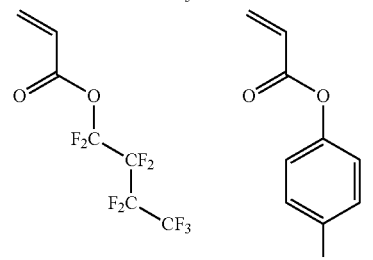

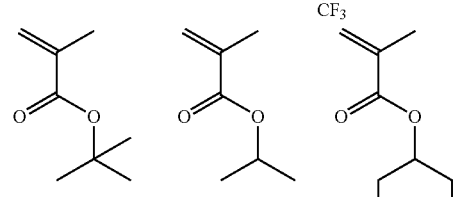

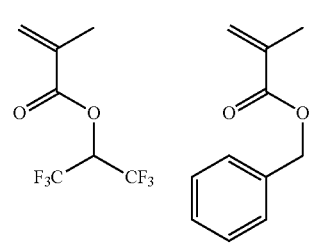

Copolymer (A) can be obtained by a known polymerization method. Examples of such a known polymerization method include radical polymerization, anionic polymerization, and cationic polymerization. Various known techniques, such as solution polymerization, suspension polymerization, emulsion polymerization, and bulk polymerization, may be used.

As a polymerization initiator used in the polymerization, for example, 2,2'-azobis(isobutyronitrile), 2,2'-azobis(2-methylbutyronitrile), 2,2'-azobis(2,4-dimethylvaleronitrile), 4,4'-azobis(4-cyanovaleric acid), 2,2'-azobis(2,4-dimethylvaleronitrile), 2,2'-azobis(4-methoxy-2,4-dimethylvaleronitrile), 2,2'-azobis(isobutyronitrile), 1,1'-azobis(cyclohexane-1-carbonitrile), 1-[(1-cyano-1-methylethyl)azo]formamide, 2,2'-azobis[2-(2-imidazolin-2-yl)propane] dihydrochloride, 2,2'-azobis[2-(2-imidazolin-2-yl)propane], or 2,2'-azobis(2-methylpropionamidine) dihydrochloride may be used.

As a solvent used in the polymerization, for example, dioxane, ethylene glycol monomethyl ether, ethylene glycol monoethyl ether, methylcellosolve acetate, ethylcellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, or butyl lactate may be used. The solvent may be used alone or in combination.

Copolymer (A) used in the present invention can be obtained by conducting a reaction while stirring under reaction conditions at 50 to 200° C. for 1 to 48 hours.

The thus obtained solution containing copolymer (A) may be used as such for preparing an upper-layer film forming composition. Alternatively, copolymer (A) may be precipitated in a poor solvent, such as methanol, ethanol, isopropanol, water, or a mixed solvent thereof, isolated, recovered and used.

The isolated copolymer (A) may be redissolved as such in the below-mentioned ether compound having 8 to 16 carbon atoms before use, or may be dried before use. When copolymer (A) is dried, desirable drying conditions are in an oven, for example, at 30 to 100° C. for 6 to 48 hours. Copolymer (A) may be recovered, and then redissolved in the below-mentioned ether compound having 8 to 16 carbon atoms to prepare a composition of the present invention, which may be used as an upper-layer film forming composition.

The weight average molecular weight of copolymer (A) used in the present invention, as measured by a gel permeation chromatography (GPC) method, varies depending on, for example, the application solvent used and the solution viscosity, but it ranges, for example, from 5,000 to 500,000, preferably from 10,000 to 100,000, in terms of a molecular weight determined using a conversion calibration curve obtained from the polystyrene.

[(B) Solvent]

The solvent used in the composition of the present invention is an ether compound having 8 to 16 carbon atoms. More specifically, an ether compound having 8 to 16 carbon atoms used as the solvent in the composition of the present invention (hereinafter, sometimes referred to as "ether solvent") is represented by the following formula (6).

[Formula 15]

 Formula (6)

In formula (6), each of $A_1$ and $A_2$ independently represents a linear, branched, or cyclic saturated alkyl group having 1 to 15 carbon atoms and being optionally substituted.

Examples of linear, branched, or cyclic saturated alkyl groups having 1 to 15 carbon atoms include a methyl group, an ethyl group, a n-propyl group, an i-propyl group, a cyclopropyl group, a n-butyl group, an i-butyl group, a s-butyl group, a t-butyl group, a cyclobutyl group, a 1-methyl-cyclopropyl group, a 2-methyl-cyclopropyl group, a n-pentyl group, a n-hexyl group, a n-heptyl group, a n-octyl group, a n-nonyl group, a n-decanyl group, a n-undecanyl group, a n-dodecanyl group, a n-tridecanyl group, a n-tetradecanyl group, a n-pentadecanyl group, a 1-methyl-n-butyl group, a 2-methyl-n-butyl group, a 3-methyl-n-butyl group, a 1,1-dimethyl-n-propyl group, a 1,2-dimethyl-n-propyl group, a 2,2-dimethyl-n-propyl group, a 1-ethyl-n-propyl group, a cyclopentyl group, a 1-methyl-cyclobutyl group, a 2-methyl-cyclobutyl group, a 3-methyl-cyclobutyl group, a 1,2-dimethyl-cyclopropyl group, a 2,3-dimethyl-cyclopropyl group, a 1-ethyl-cyclopropyl group, a 2-ethyl-cyclopropyl group, a n-hexyl group, a 1-methyl-n-pentyl group, a 2-methyl-n-pentyl group, a 3-methyl-n-pentyl group, a 4-methyl-n-pentyl group, a 1,1-dimethyl-n-butyl group, a 1,2-dimethyl-n-butyl group, a 1,3-dimethyl-n-butyl group, a 2,2-dimethyl-n-butyl group, a 2,3-dimethyl-n-butyl group, a 3,3-dimethyl-n-butyl group, a 1-ethyl-n-butyl group, a 2-ethyl-n-butyl group, a 1,1,2-trimethyl-n-propyl group, a 1,2,2-trimethyl-n-propyl group, a 1-ethyl-1-methyl-n-propyl group, a 1-ethyl-2-methyl-n-propyl group, a cyclohexyl group, a 1-methyl-cyclopentyl group, a 2-methyl-cyclopentyl group, a 3-methyl-cyclopentyl group, a 1-ethyl-cyclobutyl group, a 2-ethyl-cyclobutyl group, a 3-ethyl-cyclobutyl group, a 1,2-dimethyl-cyclobutyl group, a 1,3-dimethyl-cyclobutyl group, a 2,2-dimethyl-cyclobutyl group, a 2,3-dimethyl-cyclobutyl group, a 2,4-dimethyl-cyclobutyl group, a 3,3-dimethyl-cyclobutyl group, a 1-n-propyl-cyclopropyl group, a 2-n-propyl-cyclopropyl group, a 1-i-propyl-cyclopropyl group, a 2-i-propyl-cyclopropyl group, a 1,2,2-trimethyl-cyclopropyl group, a 1,2,3-trimethyl-cyclopropyl group, a 2,2,3-trimethyl-cyclopropyl group, a 1-ethyl-2-methyl-cyclopropyl group, a 2-ethyl-i-methyl-cyclopropyl group, a 2-ethyl-2-methyl-cyclopropyl group, and a 2-ethyl-3-methyl-cyclopropyl group.

Of these, preferred solvents are dibutyl ether, diisobutyl ether, di-tert-butyl ether, dipentyl ether, diisoamyl ether, dihexyl ether, dioctyl ether, and cyclopentylmethyl ether, each having excellent balance between the solubility of copolymer (A) and the insolubility of the block copolymer in the present invention.

Further preferred solvents are dibutyl ether, diisobutyl ether, and diisoamyl ether, and especially preferred is diisoamyl ether. The ether solvent may be used alone or in combination.

For example, in convenience to the synthesis of copolymer (A) used in the present invention, the following organic solvents may be mixed with the above-mentioned ether solvents. Such organic solvents are, for example, those enumerated in the above item for the method for producing copolymer (A). The solvent other than the above-mentioned ether solvent may be present in an amount of 0.01 to 13% by mass, relative to the mass of the ether solvent.

[Additives]

The upper-layer film forming composition of the present invention may further contain such additives as a surfactant, a rheology modifier, and the like.

To the upper-layer film forming composition of the present invention, in addition to the above-mentioned components, if necessary, for example, a rheology modifier and a surfactant may be further added. The rheology modifier is added mainly for the purpose of improving the fluidity of the composition of the present invention. Specific examples of rheology modifiers include phthalic acid derivatives, such as dimethyl phthalate, diethyl phthalate, diisobutyl phthalate, dihexyl phthalate, and butylisodecyl phthalate; adipic acid derivatives, such as dinormalbutyl adipate, diisobutyl adipate, diisooctyl adipate, and octyldecyl adipate; maleic acid derivatives, such as dinormalbutyl maleate, diethyl maleate, and dinonyl maleate; oleic acid derivatives, such as methyl oleate, butyl oleate, and tetrahydrofurfuryl oleate; and stearic acid derivatives, such as normalbutyl stearate and glyceryl stearate. The rheology modifier is generally incorporated into the composition of the present invention in an amount of less than 30% by mass per 100% by mass of the composition.

A surfactant may be incorporated into the upper-layer film forming composition of the present invention for preventing, for example, the occurrence of pinholes or striation and further improving the application properties free from the surface unevenness. Examples of surfactants include nonionic surfactants, e.g., polyoxyethylene alkyl ethers, such as polyoxyethylene lauryl ether, polyoxyethylene stearyl ether, polyoxyethylene cetyl ether, and polyoxyethylene oleyl ether; polyoxyethylene alkylaryl ethers, such as polyoxyethylene octylphenol ether and polyoxyethylene nonylphenol ether; polyoxyethylene-polyoxypropylene block copolymers; sorbitan fatty acid esters, such as sorbitan monolaurate, sorbitan monopalmitate, sorbitan monostearate, sorbitan monooleate, sorbitan trioleate, and sorbitan tristearate; and polyoxyethylene sorbitan fatty acid esters, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine surfactants, such as EFTOP EF301, EF303, EF352 (manufactured by Tohchem Products Co., Ltd.), MEGAFACE F171, F173 (manufactured by DIC Corporation), Fluorad FC430, FC431 (manufactured by Sumitomo 3M), AsahiGuard AG710, Surflon S-382, SC101, SC102, SC103, SC104, SC105, SC106 (manufactured by Asahi Glass Co., Ltd.), and Ftergent Series (manufactured by NEOS Company Limited); and organosiloxane polymer KP341 (manufactured by Shin-Etsu Chemical Co., Ltd.). The amount of the surfactant incorporated into the upper-layer film forming composition of the present invention is usually 0.2% by mass or less, preferably 0.1% by mass or less, per 100% by mass of the composition. The surfactant may be used alone or in combination.

The amount of copolymer (A) contained in the composition, in terms of solids, is preferably 20% by mass or more, for example, it ranges from 20 to 100% by mass, or from 30 to 100% by mass. The solid content of the composition of the present invention ranges preferably from 0.1 to 50% by mass, more preferably from 0.3 to 30% by mass. The solid content refers to the content of solid left behind after removing the solvent component from the upper-layer film forming composition.

The upper-layer film forming composition of the present invention can be produced by mixing (for example, by stirring and mixing at room temperature to 40° C.) copolymer (A), an ether compound having 8 to 16 carbon atoms as a solvent, and optionally any of the above-mentioned additives, according to the above-mentioned formulation.

2. Method for Forming a Block Copolymer Phase-Separated Pattern

The upper-layer film forming composition of the present invention is used for causing phase separation in a layer comprising a block copolymer formed on a substrate.

The method for forming a block copolymer phase-separated pattern of the present invention comprises the steps of:
(1) forming a block copolymer layer on a substrate;
(2) forming an upper-layer film on the block copolymer layer with the above-mentioned upper-layer film forming composition; and
(3) causing phase separation in the block copolymer layer formed on the substrate.

Step (1) of Forming a Block Copolymer Layer on a Substrate

Block copolymers are a combination of more than one chemically distinguished polymer blocks covalently bonded to each other. A number of uses have been proposed for block copolymers based on their capability of forming a nanometer-scale pattern. For example, block copolymer self-organized patterns can be used as a nanolithography mask or as a template for synthesis of additional inorganic or organic structures. The use can be realized utilizing the difference in etching rate of each of the blocks in a block copolymer.

The block copolymer used in the present invention comprises organic polymer chain (A) having organic monomer (a) as a unit structure, and polymer chain (B) having monomer (b) different from organic monomer (a) as a unit structure and being bonded to organic polymer chain (A).

The solid content of the self-organized film forming composition may be within the range of from 0.1 to 10% by mass, from 0.1 to 5% by mass, or from 0.1 to 3% by mass. The solid content refers to the content of solid left behind after removing the solvent from the film forming composition.

The proportion of the block copolymer to the solids may range from 30 to 100% by mass, from 50 to 100% by mass, from 50 to 90% by mass, or from 50 to 80% by mass.

Two or three or more types of blocks may be present in the block copolymer. And two or three or more number of each block may be present in the block copolymer.

By changing polymer chain (B), for example, adjacent polymer chain (C) having monomer (c) as a unit structure can be used.

For the block polymer, possible combinations of blocks include AB, ABAB, ABA, and ABC.

One of the methods for synthesizing a block copolymer is living radical polymerization or living cationic polymerization, which consists of an initiation reaction and a propagation reaction, free from any side reaction that deactivates the active polymer chain ends. The active polymer chain ends are allowed to continue chain extending reaction during the polymerization process. By inhibiting potential chain transfer, polymer (A) having a uniform length can be obtained. When another monomer (b) is added to the system while keeping alive the active polymer chain ends of polymer (A), the polymerization progresses in the co-presence of monomer (b) to permit formation of block copolymer (AB).

For example, when two types of blocks, i.e., blocks A and B are present, the molar ratio of polymer chain (A) and polymer chain (B) may be 1:9 to 9:1, preferably 3:7 to 7:3.

The volume ratio of the block copolymer in the present invention is, for example, 30:70 to 70:30.

Homopolymer A or B is a polymerizable compound having at least one radically polymerizable reactive group (vinyl group or vinyl group-containing organic group).

The weight average molecular weight Mw of the block copolymer used in the present invention preferably ranges from 1,000 to 100,000, or from 5,000 to 100,000. When the weight average molecular weight Mw of the block copolymer is less than 1,000, the application properties to a substrate are likely to be poor, and, when the weight average molecular weight Mw of the block copolymer is 100,000 or more, the solubility of the block copolymer in a solvent is likely to be poor.

The polydispersity (Mw/Mn) of the block copolymer in the present invention preferably ranges from 1.00 to 1.50, especially preferably from 1.00 to 1.20.

Specific examples of block copolymers include combinations of an aromatic polymer chain and an acrylic resin polymer chain. More specifically, they include a combination of a poly(vinylpyridine) derivative polymer and a polyacrylate derivative polymer, such as a combination of poly(4-vinylpyridine) and polymethyl methacrylate; a combination of a polyacrylic acid derivative polymer and a polystyrene derivative polymer; and a combination of a poly(hydroxystyrene) derivative polymer and a polyacrylate derivative polymer.

Further, a combination of a silicon-free polymer chain with a silicon-containing polymer chain [e.g., a polysilane, such as polydihexylsilane; a polysiloxane, such as polydimethylsiloxane; or a silylated polystyrene derivative, such as poly(trimethylsilylstyrene) or poly(pentamethyldisilylstyrene)] may be preferable, because, for example, the difference in the dry etching rate between the chains can be increased.

Particularly, the above-mentioned silylated polystyrene derivative is preferably poly(4-trimethylsilylstyrene) or poly(4-pentamethyldisilylstyrene), each having a substituent at the 4-position.

Of these, a combination of a silylated polystyrene derivative with a polystyrene derivative polymer, a combination of two different polystyrene derivative polymers, or a combination of a silylated polystyrene derivative polymer with a polylactide is preferred.

Of these, a combination of a silylated polystyrene derivative having a substituent at the 4-position with a polystyrene derivative polymer having a substituent at the 4-position, a combination of two different polystyrene derivative polymers having a substituent at the 4-position, or a combination of a silylated polystyrene derivative polymer having a substituent at the 4-position with a polylactide is preferred.

More preferred specific examples of block copolymers include a combination of poly(trimethylsilylstyrene) with polymethoxystyrene, a combination of polystyrene with poly(tert-butylstyrene), a combination of polystyrene with poly(trimethylsilylstyrene), and a combination of poly(trimethylsilylstyrene) with poly(D,L-lactide).

More preferred specific examples of block copolymers include a combination of poly(4-trimethylsilylstyrene) with poly(4-methoxystyrene), a combination of polystyrene with poly(4-tert-butylstyrene), a combination of polystyrene with poly(4-trimethylsilylstyrene), and a combination of poly(4-trimethylsilylstyrene) with poly(D,L-lactide).

The substrate is selected from the group consisting of silicon, silicon oxide, glass, surface-modified glass, a plastic, a ceramic, a transparent substrate, a flexible substrate, and a substrate used in roll-to-roll processing (or combinations thereof). Preferred is a silicon wafer, quartz, glass, or a plastic, and more preferred is a silicon wafer.

The substrate may be provided with, if necessary, a lower-layer film for neutralizing the surface energy. The lower-layer film is applied onto the substrate by a method commonly used, such as spin coating, so that the applied film has a predetermined thickness, and then, if necessary, subjected to, for example, heating or immersion.

The block copolymer is applied onto the substrate or lower-layer film by a method commonly used, such as spin coating, so that the applied copolymer film has a predetermined thickness.

Step (2) of Forming an Upper-Layer Film on the Block Copolymer Layer with the Upper-Layer Film Forming Composition The upper-layer film forming composition is as described above. The thus prepared upper-layer film forming composition is applied onto the block copolymer layer by a method commonly used, such as spin coating, to form an upper-layer film. The thickness of the formed upper-layer film is not particularly limited, but generally ranges from 3 to 100 nm, preferably from 10 to 70 nm, especially preferably from 20 to 60 nm. When the thickness of the upper-layer film is 3 nm or less, a desired uniform block copolymer phase-separated pattern may not be formed. When the thickness of the upper-layer film is 100 nm or more, a prolonged time may be disadvantageously needed for etching. The upper-layer film forming composition of the present invention is dissolved in a solvent or solvent mixture that does not damage the block copolymer, does not dissolve the block copolymer, and does not substantially swell the block copolymer, and therefore is extremely advantageous.

Step (3) of Causing Phase Separation in the Block Copolymer Layer Formed on the Substrate Phase separation in the block copolymer layer may be carried out in the presence of the upper-layer film by a treatment for carrying out reorientation of the block copolymer material, for example, a treatment with ultrasonic waves, a treatment with a solvent, or heat annealing. In many uses, it is desirable to achieve phase separation in the block copolymer layer by merely heating or by the so-called heat annealing. The heat annealing can be conducted in the air or in an inert gas under atmospheric pressure, reduced pressure or under pressure conditions.

Phase separation in the block copolymer layer forms block copolymer domains oriented substantially vertically on the surface of the substrate or lower-layer film. The morphology of the domains is, for example, lamellar, spherical, or cylindrical. A gap between the domains is, for example, 50 nm or less. By the method of the present invention, a structure having a desired size, shape, orientation, and periodicity can be formed.

The upper-layer film may be released after performing phase separation in the block copolymer layer. The release may be made using, for example, a solvent or solvent mixture (solvent for release) that does not damage the block copolymer, does not dissolve the block copolymer, and does not substantially swell the block copolymer. The released upper-layer film composition may be isolated and reused. The isolation may be conducted, for example, by a method commonly used, such as precipitation or distillation.

The method for producing a pattern of the present invention comprises the steps of:

(1) forming a block copolymer layer on a substrate;

(2) forming an upper-layer film on the block copolymer layer with the above-mentioned upper-layer film forming composition;

(3) causing phase separation in the block copolymer layer formed on the substrate; and (4) subjecting the phase-separated block copolymer layer to etching.

The phase-separated block copolymer layer by the above-mentioned method may be further subjected to the step of etching the layer. Usually, before etching, part of the phase-separated block copolymer is removed. The etching may be conducted by a known means. This method may be used for producing a semiconductor substrate.

Thus, the method for producing a semiconductor device of the present invention comprises the steps of:

(1) forming a block copolymer layer on a substrate;
(2) forming an upper-layer film on the block copolymer layer with the above-mentioned upper-layer film forming composition;
(3) causing phase separation in the block copolymer layer formed on the substrate;
(4) subjecting the phase-separated block copolymer layer to etching; and
(5) subjecting the substrate to etching.

In the etching, for example, a gas of tetrafluoromethane ($CF_4$), perfluorocyclobutane ($C_4F_8$), perfluoropropane ($C_3F_8$), trifluoromethane, carbon monoxide, argon, oxygen, nitrogen, sulfur hexafluoride, difluoromethane, nitrogen trifluoride, chlorine trifluoride, chlorine, trichloroborane, or dichloroborane may be used. A halogen gas is preferably used, and a fluorine-based gas is more preferably used. Examples of fluorine-based gases include tetrafluoromethane ($CF_4$), perfluorocyclobutane ($C_4F_8$), perfluoropropane ($C_3F_8$), trifluoromethane, and difluoromethane ($CH_2F_2$).

Use of the pattern of the phase-separated block copolymer layer formed from the upper-layer film forming composition of the present invention enables providing a desired morphology to a substrate to be processed by etching, to produce a suitable semiconductor device.

EXAMPLES

Hereinbelow, the present invention will be described in more detail with reference to the following Examples and Comparative Examples, which should not be construed as limiting the scope of the present invention.

The weight average molecular weight (Mw) of polymer (A) shown in the Synthesis Examples below is the result of measurement by a gel permeation chromatography (GPC) method. In the measurement, a GPC apparatus, manufactured by Tosoh Corp., is used, and the conditions for the measurement are as follows. Measuring apparatus: HLC-8020GPC [trade name] (manufactured by Tosoh Corp.) GPC Columns: TSKgel G2000HXL: two columns; G3000HXL: one column; G4000HXL: one column [trade name] (each of which is manufactured by Tosoh Corp.)
Column temperature: 40° C.
Solvent: Tetrahydrofuran (THF)
Flow rate: 1.0 ml/minute
Standard sample: Polystyrene (manufactured by Tosoh Corp.)

[Synthesis Example 1] Synthesis of Polymer 1

3.20 g of N-cyclohexylmaleimide, 2.00 g of 4-tert-butylstyrene, 0.76 g of tert-butyl methacrylate, and 0.05 g of 2,2'-azobisisobutyronitrile were dissolved in 24.0 g of propylene glycol monomethyl ether acetate, and then the resultant solution was heated and stirred at 140° C. for about 2 hours. The resultant reaction mixture was added dropwise to methanol, and the deposited material was collected by filtration by means of suction, and then subjected to vacuum drying at 60° C. to recover polymer 1. The polymer had a weight average molecular weight Mw of 28,100, as determined by GPC using a molecular weight conversion calibration curve obtained from the polystyrene.

[Synthesis Example 2] Synthesis of Polymer 2

3.14 g of N-cyclohexylmaleimide, 2.24 g of 4-tert-butylstyrene, 0.45 g of isopropyl methacrylate, and 0.18 g of 2,2'-azobisisobutyronitrile were dissolved in 24.0 g of propylene glycol monomethyl ether acetate, and then the resultant solution was heated and stirred at 140° C. for about 2 hours. The resultant reaction mixture was added dropwise to methanol, and the deposited material was collected by filtration by means of suction, and then subjected to vacuum drying at 60° C. to recover polymer 2. The polymer had a weight average molecular weight Mw of 12,800, as determined by GPC using a molecular weight conversion calibration curve obtained from the polystyrene.

[Synthesis Example 3] Synthesis of Polymer 3

3.06 g of N-cyclohexylmaleimide, 2.19 g of 4-tert-butylstyrene, 0.58 g of cyclohexyl methacrylate, and 0.18 g of 2,2'-azobisisobutyronitrile were dissolved in 24.0 g of propylene glycol monomethyl ether acetate, and then the resultant solution was heated and stirred at 140° C. for about 2 hours. The resultant reaction mixture was added dropwise to methanol, and the deposited material was collected by filtration by means of suction, and then subjected to vacuum drying at 60° C. to recover polymer 3. The polymer had a weight average molecular weight Mw of 11,700, as determined by GPC using a molecular weight conversion calibration curve obtained from the polystyrene.

[Synthesis Example 4] Synthesis of Polymer 4

3.01 g of N-cyclohexylmaleimide, 2.42 g of 4-tert-butylstyrene, 0.40 g of 1,1,1,3,3,3-hexafluoroisopropyl methacrylate, and 0.18 g of 2,2'-azobisisobutyronitrile were dissolved in 24.0 g of propylene glycol monomethyl ether acetate, and then the resultant solution was heated and stirred at 140° C. for about 2 hours. The resultant reaction mixture was added dropwise to methanol, and the deposited material was collected by filtration by means of suction, and then subjected to vacuum drying at 60° C. to recover polymer 4. The polymer had a weight average molecular weight Mw of 14,300, as determined by GPC using a molecular weight conversion calibration curve obtained from the polystyrene.

[Synthesis Example 5] Synthesis of Polymer 5

2.13 g of N-cyclohexylmaleimide, 2.64 g of 4-tert-butylstyrene, 0.23 g of 2-vinylnaphthalene, and 1.00 g of 2,2'-azobisisobutyronitrile were dissolved in 24.0 g of propylene glycol monomethyl ether acetate, and then the resultant solution was heated and stirred at 140° C. for about 2 hours. The resultant reaction mixture was added dropwise to methanol, and the deposited material was collected by filtration by means of suction, and then subjected to vacuum drying at 60° C. to recover polymer 4. The polymer had a weight average molecular weight Mw of 6,000, as determined by GPC using a molecular weight conversion calibration curve obtained from the polystyrene.

Example 1

(Preparation of Upper-Layer Film Composition)
0.25 g of the resin obtained in Synthesis Example 1 was dissolved in 9.75 g of diisoamyl ether to obtain a 2.5% by mass solution. Then, the obtained solution was subjected to filtration using a polyethylene microfilter having a pore diameter of 0.2 μm to prepare a solution of an upper-layer film forming composition for a self-organized film.

(Preparation of Block Copolymer 1)
0.5 g of a block copolymer, poly(4-methoxystyrene)/poly(4-trimethylsilylstyrene) copolymer (weight average molecular weight Mw: 30,200, polydispersity: 1.12, volume ratio: 50:50), was dissolved in 24.5 g of propylene glycol monomethyl ether acetate to obtain a 2% by mass solution. Then, the obtained solution was subjected to filtration using a polyethylene microfilter having a pore diameter of 0.02 m to prepare a solution of a self-organized film forming composition comprising the block copolymer.

(Preparation of Lower-Layer Film Forming Composition)

0.1 g of poly(styrene-co-4-tert-butylstyrene) having hydroxyl group at the terminals was dissolved in 19.9 g of propylene glycol monomethyl ether acetate to obtain a 0.5% by mass solution. Then, the obtained solution was subjected to filtration using a polyethylene microfilter having a pore diameter of 0.02 μm to prepare a solution of a lower-layer film forming composition for a self-organized film comprising the block copolymer.

(Evaluation of Self-Organization of Block Copolymer)

The above-obtained lower-layer film forming composition for a self-organized film was applied onto a silicon wafer, and heated on a hotplate at 240° C. for one minute, and then immersed in propylene glycol monomethyl ether acetate for one minute to obtain a lower-layer film (A layer). The self-organized film forming composition comprising the block copolymer was applied onto the lower-layer film by a spin coater, and heated on a hotplate at 100° C. for one minute to form a self-organized film (B layer) having a thickness of 40 nm. The upper-layer film forming composition was applied onto the self-organized film by a spinner, and then heated on a hotplate at 210° C. for 5 minutes to induce a micro-phase-separated structure in the block copolymer. FIG. 1 shows the arrangement of the layers.

(Observation of Micro-Phase-Separated Structure)

Figure 2:
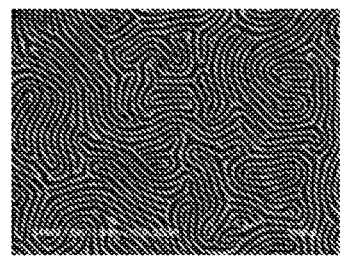
FIG. 2 A scanning electron photomicrograph of a block copolymer layer phase-separated using the upper-layer film composition of the present invention (Example 1).

The silicon wafer having the micro-phase-separated structure induced was subjected to etching using an etching machine (Lam 2300 Versys Kiyo45), manufactured by Lam Research Corporation, and using $O_2$ gas as an etching gas for 30 seconds so that the upper-layer film was removed and the polymethoxystyrene region was preferentially etched. Subsequently, the resultant structure was observed by means of an electron microscope (S-4800) (FIG. 2).

Examples 2 to 5

Preparation of the sample and formation of the micro-phase-separated structure of block copolymer were carried out in substantially the same manner as in Example 1 except for using each of polymers 2 to 5 instead of polymer 1.

Comparative Example 1

(Preparation of Upper-Layer Film Composition)

An attempt was made to dissolve 0.25 g of a trimethylamine salt of a copolymer of maleic anhydride, 3,5-ditert-butylstyrene, and styrene, which is a resin applied to the upper-layer film using a polar solvent, in 4.85 g of diisoamyl ether to prepare a 3% by mass solution, but in vain. The copolymerized polymer was deposited, so that a solution was unable to be prepared.

Comparative Example 2

(Preparation of an Upper-Layer Film Composition)

An attempt was made to dissolve 0.25 g of a copolymer of maleic anhydride, 3,5-ditert-butylstyrene, and styrene in 4.85 g of diisoamyl ether to prepare a 3% by mass solution, but in vain. The copolymerized polymer was deposited, so that a solution was unable to be prepared.

(Examination on the Solubility and Block Copolymer Orientation)

The solubility of the upper-layer film and the orientation of the block copolymer prepared in Examples 1 to 5 and Comparative Examples 1 and 2 above were examined. The results are shown in Table 1 and FIG. 2.

TABLE 1

|  | Solubility of upper layer film | Block copolymer orientation |
|---|---|---|
| Example 1 | Soluble | Vertical orientation |
| Example 2 | Soluble | Vertical orientation |
| Example 3 | Soluble | Vertical orientation |
| Example 4 | Soluble | Vertical orientation |
| Example 5 | Soluble | Vertical orientation |
| Comparative Example 1 | Deposited (Insoluble) | — |
| Comparative Example 2 | Deposited (Insoluble) | — |

As seen from Table 1, the top coat prepared using the upper-layer film forming composition of the present invention exhibits a good solubility in a hydrophobic solvent which does not dissolve the block copolymer, and can induce vertical orientation of the block copolymer.

INDUSTRIAL APPLICABILITY

An upper-layer film forming composition that provides an upper-layer film which can induce vertical orientation of a block copolymer without dissolving or swelling a layer comprising the block copolymer formed on a substrate, and which exhibits a good solubility in a hydrophobic solvent is extremely useful from an industrial point of view.

The invention claimed is:

1. A composition, comprising:
   an upper-layer that is present directly on a layer comprising a block copolymer that is formed on a substrate, the upper layer including:
   (A) a random copolymer comprising (a) a unit structure derived from maleimide structure and a unit structure derived from styrene structure; and
   (B) an ether compound as a solvent, the ether compound represented by the following formula (6):

      Formula (6)

wherein each of $A_1$ and $A_2$ independently represents a linear, branched, or cyclic saturated alkyl group having 1 to 15 carbon atoms and being optionally substituted, with the proviso that the ether compound has 8 to 16 carbon atoms; wherein
   the layer comprising the block copolymer has domains of the block copolymer that are oriented vertically; and the upper-layer is in the form of an upper-layer film, which is configured for causing phase separation and inducing reorientation of the block copolymer such that the domains of the block copolymer that are oriented vertically are present on the surface of the substrate without dissolving or swelling the layer comprising the block copolymer formed on the substrate, and
   the upper-layer film is soluble in a hydrophobic solvent and the block copolymer is insoluble in the hydrophobic solvent.

2. The composition according to claim 1, wherein the unit structure derived from maleimide structure is represented by the following formula (1):

Formula (1)

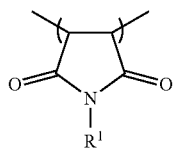

wherein R¹ represents a hydrogen atom, a linear, branched, or cyclic alkyl group having 1 to 10 carbon atoms, or an aryl group having 6 to 10 carbon atoms and being optionally substituted with a halogen atom.

3. The composition according to claim 1, wherein the unit structure derived from styrene structure is represented by the following formula (2):

Formula (2)

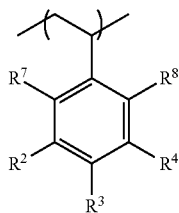

wherein each of $R^2$ to $R^4$, $R^7$, and $R^8$ independently represents a hydrogen atom, an alkoxy group having 1 to 5 carbon atoms, or a linear, branched, or cyclic alkyl group having 1 to 10 carbon atoms and being optionally substituted with a halogen atom.

4. The composition according to claim 2, wherein the unit structure derived from styrene structure is represented by the following formula (2):

Formula (2)

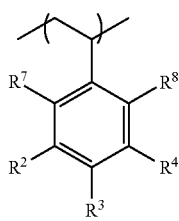

wherein each of $R^2$ to $R^4$, $R^7$, and $R^8$ independently represents a hydrogen atom, an alkoxy group having 1 to 5 carbon atoms, or a linear, branched, or cyclic alkyl group having 1 to 10 carbon atoms and being optionally substituted with a halogen atom.

5. The composition according to claim 1, wherein the random copolymer (A) further comprises (b) a unit structure derived from (meth)acryl group.

6. The composition according to claim 2, wherein the random copolymer (A) further comprises (b) a unit structure derived from (meth)acryl group.

7. The composition according to claim 3, wherein the random copolymer (A) further comprises (b) a unit structure derived from (meth)acryl group.

8. The composition according to claim 4, wherein the random copolymer (A) further comprises (b) a unit structure derived from (meth)acryl group.

9. The composition according to claim 5, wherein the unit structure derived from (meth)acryl group is represented by the following formula (3):

Formula (3)

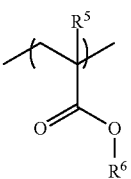

wherein each of $R^5$ and $R^6$ independently represents a hydrogen atom, an alkoxy group having 1 to 5 carbon atoms, or a linear, branched, or cyclic alkyl group having 1 to 10 carbon atoms and being optionally substituted with a halogen atom.

10. The composition according to claim 6, wherein the unit structure derived from (meth)acryl group is represented by the following formula (3):

Formula (3)

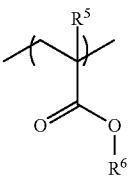

wherein each of $R^5$ and $R^6$ independently represents a hydrogen atom, an alkoxy group having 1 to 5 carbon atoms, or a linear, branched, or cyclic alkyl group having 1 to 10 carbon atoms and being optionally substituted with a halogen atom.

11. The composition according to claim 7, wherein the unit structure derived from (meth)acryl group is represented by the following formula (3):

Formula (3)

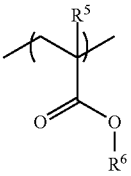

wherein each of $R^5$ and $R^6$ independently represents a hydrogen atom, an alkoxy group having 1 to 5 carbon atoms, or a linear, branched, or cyclic alkyl group having 1 to 10 carbon atoms and being optionally substituted with a halogen atom.

12. The composition according to claim 8, wherein the unit structure derived from (meth)acryl group is represented by the following formula (3):

Formula (3)

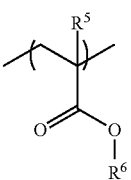

wherein each of $R^5$ and $R^6$ independently represents a hydrogen atom, an alkoxy group having 1 to 5 carbon atoms, or a linear, branched, or cyclic alkyl group having 1 to 10 carbon atoms and being optionally substituted with a halogen atom.

13. The composition according to claim 1, comprising copolymer (A) from copolymerization of a monomer mixture comprising:

a compound represented by the following formula (4):

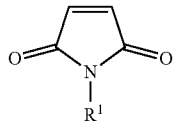

Formula (4)

wherein $R^1$ represents a hydrogen atom, a linear, branched, or cyclic alkyl group having 1 to 10 carbon atoms, or an aryl group having 6 to 10 carbon atoms and being optionally substituted with a halogen atom, and a compound represented by the following formula (5):

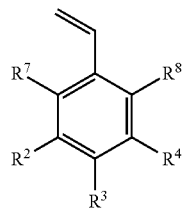

Formula (5)

wherein each of $R^2$ to $R^4$, $R^7$, and $R^8$ independently represents a hydrogen atom, an alkoxy group having 1 to 5 carbon atoms, or a linear, branched, or cyclic alkyl group having 1 to 10 carbon atoms and being optionally substituted with a halogen atom.

14. The composition according to claim 1, wherein each of the $A_1$ and $A_2$ of the ether compound independently represents a linear, branched, or cyclic saturated alkyl group having 1 to 15 carbon atoms, with the proviso that the ether compound has 8 to 16 carbon atoms.

* * * * *